United States Patent
Conte et al.

(10) Patent No.: US 7,580,289 B2
(45) Date of Patent: Aug. 25, 2009

(54) DISCHARGE CIRCUIT FOR A WORD-ERASABLE FLASH MEMORY DEVICE

(75) Inventors: Antonino Conte, Tremestieri Etneo (IT); Giampiero Sberno, Catania (IT); Mario Micciche', Agrigento (IT); Enrico Castaldo, Catania (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 302 days.

(21) Appl. No.: 11/441,925

(22) Filed: May 25, 2006

(65) Prior Publication Data

US 2007/0007561 A1    Jan. 11, 2007

(30) Foreign Application Priority Data

May 25, 2005    (EP)    ................................. 05104465

(51) Int. Cl.
*G11C 16/04*    (2006.01)
(52) U.S. Cl. .............................. 365/185.18; 365/185.2; 365/185.24
(58) Field of Classification Search ............ 365/185.18, 365/185.24, 185.2
See application file for complete search history.

(56) References Cited

U.S. PATENT DOCUMENTS

| | | | | |
|---|---|---|---|---|
| 5,892,715 A * | 4/1999 | Hirata et al. | ............ | 365/185.29 |
| 6,081,450 A * | 6/2000 | Nawaki | ................. | 365/185.11 |
| 6,667,906 B2 * | 12/2003 | Park et al. | ............. | 365/185.18 |
| 6,909,626 B2 * | 6/2005 | Torrisi et al. | ................ | 365/145 |
| 6,930,907 B2 * | 8/2005 | Sberno et al. | ............... | 365/145 |
| 7,058,754 B2 * | 6/2006 | Frayer | ........................ | 711/102 |
| 7,130,219 B2 * | 10/2006 | Conte et al. | ........... | 365/185.18 |
| 7,142,457 B2 * | 11/2006 | Lee et al. | ............... | 365/185.21 |
| 7,177,190 B2 * | 2/2007 | Lee | ........................ | 365/185.17 |
| 7,362,616 B2 * | 4/2008 | Bovino et al. | ............ | 365/185.2 |

FOREIGN PATENT DOCUMENTS

EP    0843316    5/1998

OTHER PUBLICATIONS

European Search Report for Application Serial No. EP05104465, European Patent Office, Jun. 28, 2006.

* cited by examiner

*Primary Examiner*—Tuan T Nguyen
*Assistant Examiner*—Hien N Nguyen
(74) *Attorney, Agent, or Firm*—Graybeal Jackson LLP (57) ABSTRACT

A non-volatile memory device is proposed. The memory device includes a plurality of blocks of memory cells, each block having a common biasing node for all the memory cells of the block, biasing means for providing a biasing voltage, and selection means for selectively applying the biasing voltage to the biasing node of a selected block, for each block the selection means including first switching means and second switching means connected in series, the first switching means being connected with the biasing node and the second switching means being connected with the biasing means, wherein the second switching means of all the blocks are connected in parallel, the selection means including means for closing the first switching means of the selected block and the second switching means of all the blocks, and for opening the second switching means of each unselected block.

21 Claims, 4 Drawing Sheets

DISCHARGE CIRCUIT FOR A WORD-ERASABLE FLASH MEMORY DEVICE

PRIORITY CLAIM

This application claims priority from European patent application No. EP05104465.9, filed May 25, 2005, which is incorporated herein by reference.

TECHNICAL FIELD

An embodiment of the present invention generally relates to the memory field. More specifically, the embodiment relates to the biasing of non-volatile memory devices.

BACKGROUND

Memory devices are commonly used to store information (either temporarily or permanently) in a number of applications; particularly, in a non-volatile memory device, the information is preserved even when a power supply is off. For example, in a flash EEPROM the memory cells (typically consisting of floating gate MOS transistors) are arranged in a matrix that is integrated in a common substrate (so as to obtain a very compact structure). However, this may require that all the memory cells of the matrix be erased at the same time; for this purpose a suitable biasing voltage is applied to the common substrate; the common substrate in then discharged so as to be ready for the next operations to be performed on the memory device.

In order to provide a finer granularity of the erase operation, memory devices with a so-called page-flash as word-erasable architecture have been proposed. In this case, the memory cells are partitioned into blocks, which are integrated into corresponding insulating wells (formed in the common substrate); each block contains multiple rows of memory cells (defining corresponding words). As a result, it is possible to erase the memory cells of a single word at a time (by suitably biasing and discharging its insulating well). Typically, the word-erasable flash memories require the application of high biasing voltages (up to 10V) for obtaining acceptable erase times (comparable to the ones of the standard flash memories). These biasing voltages generally exceed the maximum absolute rating allowed by the available technology (i.e., 9V). Therefore, the switching circuits that are necessary to select the desired block are implemented with multiple transistors in a cascade configuration (so as to withstand the above mentioned high biasing voltages).

A problem of the memory devices know in the art is that a relatively large current may flow through the switching circuits (especially during the discharge of the insulating well following the erase operation).

This may cause a significant voltage drop at the multiple transistors of the switching circuits, which voltage drop may impair their correct operation.

Therefore, those transistors often must have a low resistance (to allow discharging the insulating well to the desired value). However, this may require very large transistors with a corresponding waste of area in a chip of semiconductor material where the memory device is integrated.

The problem is particular acute in the word-erasable flash memories, since they have a high number of switching circuits (i.e., one per block).

SUMMARY

According to an embodiment of the present invention, the idea of exploiting some components of the unselected blocks for biasing the selected block is suggested.

Particularly, an embodiment of the present invention proposes a non-volatile memory device. The memory device includes a plurality of blocks of memory cells; each block has a common biasing node for all the memory cells of the block. Biasing means is included for providing a biasing voltage; selection means is then used for selectively applying the biasing voltage to the biasing node of a selected block. For each block, the selection means includes first switching means and second switching means connected in series; the first switching means is connected with the biasing node and the second switching means is connected with the biasing means. Moreover, the second switching means of all the blocks are connected in parallel. The selection means then includes means for closing the first switching means of the selected block and the second switching means of all the blocks, and for opening the first switching means of each unselected blocks.

In an embodiment of the invention, the first switching means includes a first transistor and a second transistor that are connected in series and a third transistor that is connected in parallel to the series of the first and second transistor.

These transistors may be MOS transistors with their substrate terminals connected to an interconnection node (between the first and the second transistors).

In addition, in a further embodiment of the invention, the selection means is adapted to open the second and third transistors and to close the first transistor of each unselected block.

This structure may be used to bias the insulating well of the corresponding block.

For example, it may find application during an erase-discharge operation.

In this case, n-MOS transistors may be used to discharge the insulating well towards a reference voltage (i.e., the ground).

This proposed solution may be applied in a flash memory.

Advantages of this solution may be more clearly perceived when the flash memory is of the word-erasable type.

Another embodiment of the present invention provides a corresponding method for operating a memory device.

BRIEF DESCRIPTION OF THE DRAWINGS

Embodiments of the invention, however, as well as features and advantages thereof, will be best understood by reference to the following detailed description, given purely by way of a non-restrictive indication, to be read in conjunction with the accompanying drawings, in which.

DETAILED DESCRIPTION

Figure 1:
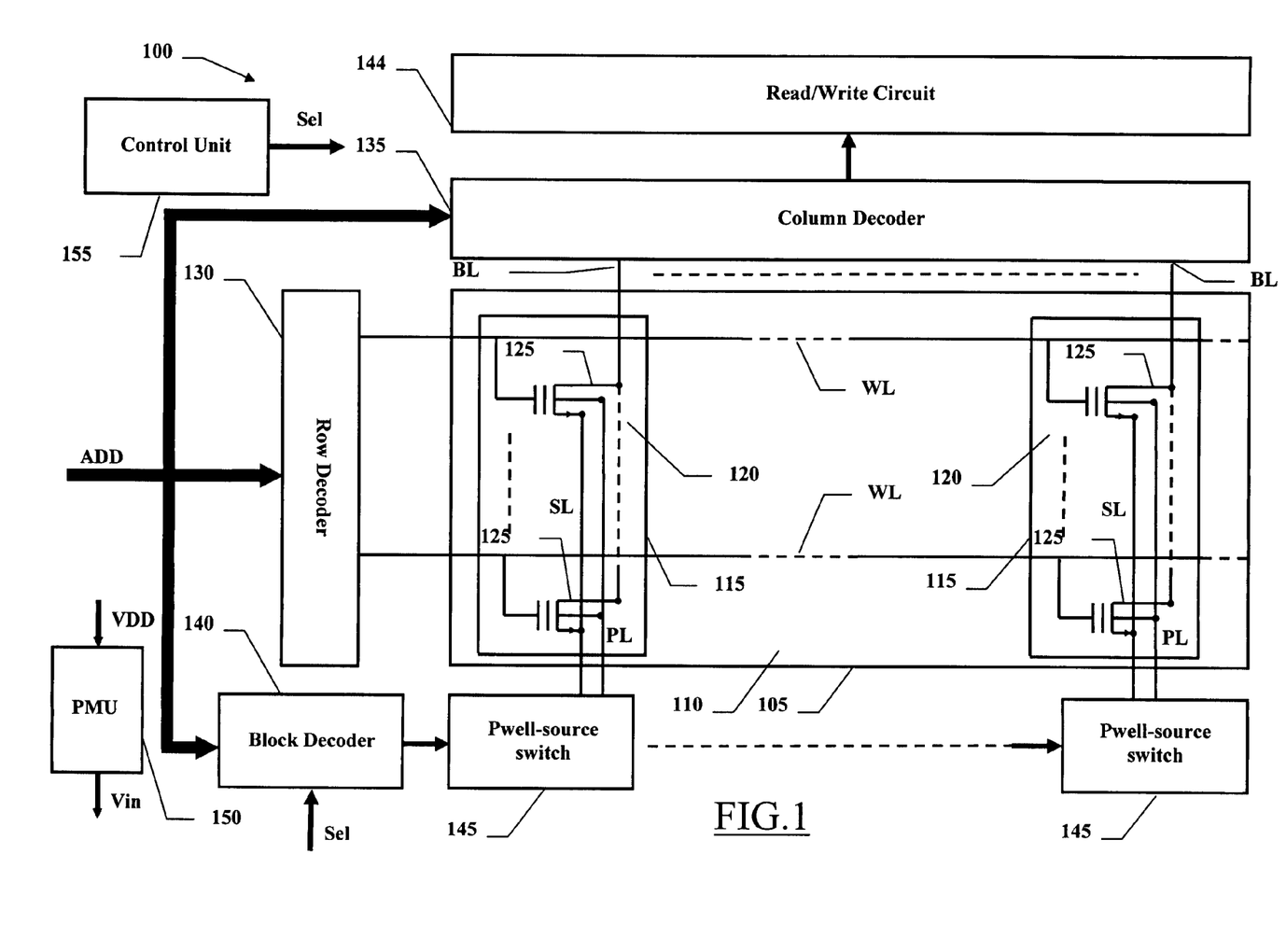
FIG. 1 is a schematic block diagram of a memory device in which a solution according to an embodiment of the invention can be used.

Referring to FIG. 1, an embodiment of a word-erasable flash memory device 100 is schematically represented. The memory device 100 includes one or more sectors or matrices 105 (only one shown in FIG. 1). Each matrix 105 is formed in a semiconductor material region 110 with a first type of conductivity (for example, of n-type). The matrix 105 includes a plurality of blocks 115, each formed in a semiconductor material region 120 with a type of conductivity opposite to the first one (for example of p-type). Each p-type region 120 represents the substrate of the corresponding block 115, where multiple memory cells 125 are formed.

In each block 115, the memory cells 125 are arranged in rows and columns. Each memory cell 125 includes a floating gate MOS transistor. The memory cells 125 of each column have the drain terminals connected to a respective bit line BL, while the memory cells 125 of each row have the gate terminals connected to a respective word line WL. Moreover, all the memory cells 125 have the source terminals connected to a common source line SL and the substrate terminals connected to a common p-well line PL. A word consists of the memory cells 125, which are included in the same block 115 and have the gate terminals connected to the same word line WL.

The memory device 100 receives an address ADD for accessing the memory cells 125 of a selected word. A portion of the address ADD is supplied to a row decoder 130, which selects the desired word line WL. Another portion of the address ADD is supplied to a column decoder 135, which selects the desired bit lines BL. A further portion of address ADD is supplied to a block decoder 140, which selects the desired block 115.

The column decoder 135 connects the selected bit lines BL to a read-write circuit 144. The read/write circuit 144 includes all the components (e.g., sense amplifiers, comparators, reference current/voltage generators, pulse generators, program load circuits and the like), which are normally required for writing the desired logic values into the selected memory cells 125 and for reading the logic values currently stored therein. The read/write circuit 144 is coupled to externally accessible terminals of the memory device 100 (not shown in FIG. 1) for receiving/delivering data.

The block decoder 140 interfaces with a p-well-source switch 145 for each block 115. Each p-well-source switch 145 includes a biasing circuitry adapted to perform the desired operations on the memory device 100; particularly, the p-well-source switch 145 applies the required biasing voltages to the source terminals (through the source line SL) and to the substrate terminals (through the p-well line PL) of the corresponding memory cells 125.

The following table lists the biasing voltages applied to the p-well line PL and to the source line SL during each operation that can be performed on the memory device 100. In the following, for the sake of simplicity, the different lines and the corresponding voltages will be denoted with the same references. In the table, the status USM (acronym for Unselected block on Selected Matrix) indicates the biasing status of an unselected block 115 that is included in a selected matrix 105. Moreover, the status UUM (acronym for Unselected block on Unselected Matrix) indicates the biasing status of an unselected block 115 that is included in an unselected matrix 105. Finally, the status SSM (acronym for Selected block on Selected Matrix) indicates the biasing status of a selected block 115 that is included in a selected matrix 105.

| STATUS | PL | SL |
| --- | --- | --- |
| Erase | SSM | 4 V → 10 V | 4 V → 10 V |
| Erase-Discharge | SSM | 10 V → 0 V | 10 V → 0 V |
| Program | SSM | −1.4 V | 0 V |
| Read | SSM | 0 V | 0 V |
| Verify | SSM | −1.4 V | 0 V |

-continued

| STATUS | PL | SL |
| --- | --- | --- |
| Erase | USM | −1.8 V | −1.8 V |
| Erase-Discharge | USM | −1.8 V | −1.8 V |
| Program | USM | 0 V | 0 V |
| Read | USM | 0 V | 0 V |
| Verify | USM | 0 V | 0 V |
| Erase | UUM | 0 V | 0 V |
| Erase-Discharge | UUM | 0 V | 0 V |
| Program | UUM | 0 V | 0 V |
| Read | UUM | 0 V | 0 V |
| Verify | UUM | 0 V | 0 V |

Particularly, when a word of a selected block 115 included in a selected matrix 105 (status SSM) is erased, the biasing voltages applied to the p-well line PL and to the source line SL (and then to the substrate terminals and to the source terminals, respectively, of the memory cells 125 to be erased) rise from 4 V to 10 V (with respect to a reference voltage, or ground).

Subsequently to the erase operation, an erase-discharge operation is typically performed. During the erase-discharge operation, the biasing voltages applied to the same p-well line PL and source line SL decrease from 10 V to 0 V. In such a way, the source terminals and the substrate terminals of the erased memory cells 125 are suitably biased for the subsequent operations that may be performed on the memory device 100.

The memory device 100 further includes a PMU (acronym for Power Management Unit) 150 and a Control Unit 155.

The PMU 150 provides the biasing voltages that are used for performing the above-described operations on the memory device 100. For example, the PMU 150 receives a power supply voltage VDD (such as 1.8-3.3 V) from the outside and outputs multiple internal voltages Vin, ranging from −1.8 V to 10 V in the example at issue. For this purpose, the PMU includes circuitry (e.g., charge pumps) adapted to generate the internal voltages Vin from the supply voltage VDD.

The Control Unit 155 provides the control signals (indicated as a whole with Sel), which are used for driving the different components of the memory device 100.

Figure 2:
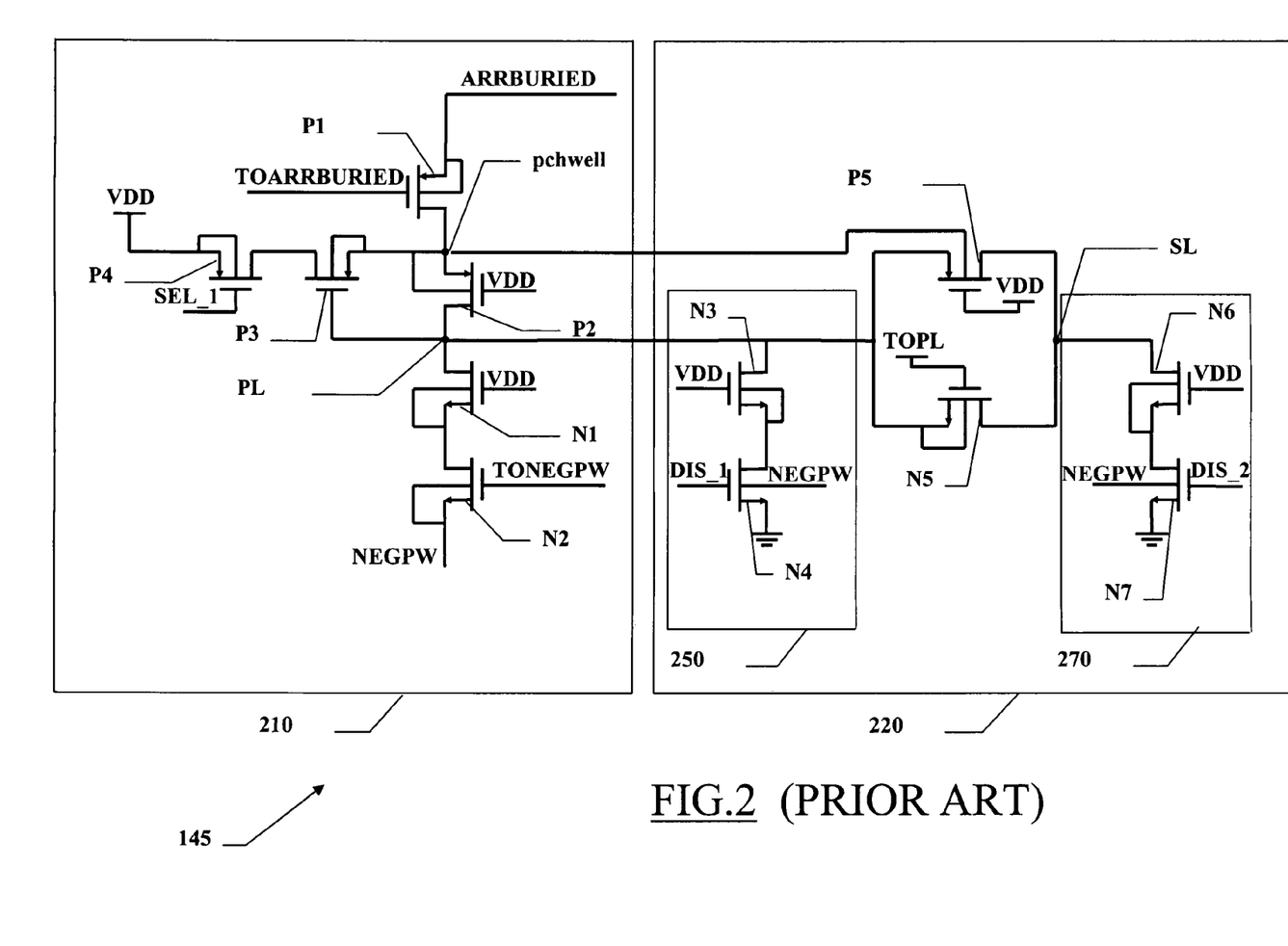
FIG. 2 is an exemplary implementation of a p-well-source switch of the memory device of FIG. 1 as is known in the prior art.

Considering now FIG. 2, an exemplary implementation of a p-well-source switch 145 known in the art is represented. The p-well-source switch 145 is formed by a p-well switch 210 (for biasing the p-well line PL) and by a source switch 220 (for biasing the source line SL).

Referring to the p-well switch 210, a p-MOS transistor P1 is cascade connected with a p-MOS transistor P2. More specifically, the transistor P1 has the drain terminal connected to the source terminal of the transistor P2. The transistor P1 has the source terminal that receives a biasing voltage ARRBURIED, and it has the gate terminal that receives a biasing voltage TOARRBURIED. The gate terminal of the transistor P2 is connected to a terminal providing the supply voltage VDD. The drain terminal of the transistor P1, defining a node identified with pchwell, is also connected to the source terminal of a p-MOS transistor P3. The transistor P3 is connected in series with a p-MOS transistor P4. The transistor P4 has the drain terminal connected to the drain terminal of the transistor P3 and the source terminal connected to the supply terminal VDD. The gate terminal of the transistor P4 receives a select signal SEL_1.

The gate terminal of the transistor P3 is connected to the drain terminal of the transistor P2 and to the drain terminal of an n-MOS transistor N1. The p-well line PL is connected to a common node between the drain terminal of the transistor N1 and the drain terminal of the transistor P2 (hereinafter denoted with the same reference PL). The transistor N1 has the gate terminal connected to the supply terminal VDD and the source terminal connected to the drain terminal of an n-MOS transistor N2. The transistor N2 has the source terminal that receives a biasing voltage NEGPW and the gate terminal that receives a biasing voltage TONEGPW.

Considering now the source switch 220, a p-well discharger 250 is connected to the node PL. The p-well discharger 250 is formed by two n-MOS transistors N3 and N4 that are cascade connected. In particular, the transistor N3 has the drain terminal connected to the node PL and the source terminal connected to the drain terminal of the transistor N4. The gate terminal of the transistor N3 is connected to the supply terminal VDD. The transistor N4 has the source terminal connected to a terminal providing the ground voltage and the gate terminal connected to a terminal providing a biasing voltage DIS_1.

Moreover, a p-MOS transistor P5 has the source terminal connected to the node PL and the drain terminal connected to a node that is coupled with the source line SL (and then denoted with the same reference). The gate terminal of the transistor P5 is connected to the supply terminal VDD. An n-MOS transistor N5 has the source terminal connected to the node PL and the drain terminal connected to the node SL. The gate terminal of the transistor N5 receives a biasing voltage TOPL.

A source discharger 270 is connected to the node SL. The source discharger 270 is formed by two n-MOS transistors N6 and N7 that are cascade connected. In particular, the transistor N6 has the drain terminal connected to the node SL and the source terminal connected to the drain terminal of the transistor N7. The gate terminal of the transistor N6 is connected to the supply terminal VDD. The transistor N7 has the source terminal connected to the ground terminal and the gate terminal connected to a terminal providing a biasing voltage DIS_2.

Most transistors of the p-well-source switch 145 have the substrate terminals that are connected to their source terminals; the only exception are the transistors P5, N4 and N7. In particular, the transistor P5 has the substrate terminal connected to the node pchwell, while the transistors N4 and N7 have the substrate terminals connected to a terminal providing the biasing voltage NEGPW. As can be seen, the transistors are arranged in pairs so as to withstand the high operative voltages of the circuit; moreover the connections of the substrate terminals of the different transistors ensure their correct operation in any situation.

At the beginning of each operation to be performed on the memory device 100 (FIG. 1) all the transistors are off and the relevant nodes are at ground.

During the erase operation, the select signal SEL_1 is brought to ground (with the voltages pchwell and PL that are at ground as well). In this biasing status, the transistors P4 and P3 switch on and consequently the voltage pchwell reaches the supply voltage VDD (applied to the source terminal of the transistor P4). At the same time, the biasing voltage TONEGPW is brought to −1.4V so that the transistor N2 remains off. Thus, no current may flow through the transistor N2 and consequently through the transistor N1. Likewise, also the transistor N4 of the p-well discharger 250 and the transistor N7 of the source discharger 270 are kept off by suitable biasing voltages DIS_1 and DIS_2, respectively (for example, −1.8V).

Next, the biasing voltage TOARRBURIED is brought to the supply voltage VDD and the biasing voltage ARRBURIED rises from 4V to 10V.

When the biasing voltage ARRBURIED exceeds by a threshold voltage (e.g., 1V) the biasing voltage TOARRBURIED, the transistor P1 switches on, and consequently the voltage pchwell, starting from the supply voltage VDD, reaches the value 10 V of the biasing voltage ARRBURIED. In this biasing condition, also the transistor P2 switches on.

The voltage PL then follows the biasing voltage ARRBURIED. The transistor P4 (that was used to bring the voltage pchwell to the starting value of VDD) now switches off. Therefore, the biasing voltage applied to the p-well line PL (and thus to the substrate of the block) will have the desired pattern from 4V to 10V.

At the same time, the transistor P5 also switches on; the biasing voltage TOPL rises from to 5V to 11V, so as to switch on the transistor N5 as well.

Therefore, the voltage PL is transferred to the node SL, which will have the same pattern from 4 V to 10 V.

During the erase-discharge operation following the erase operation, the biasing voltages DIS_1 and DIS_2 are brought to 1V so as to switch on the transistors N4 and N7, respectively. This results in a discharge current flowing through the p-well discharger 250 and the source discharger 270, thereby lowering the voltages at the nodes PL and SL towards ground. However, the discharge current may cause a significant voltage drop at the transistors N3, N4 and N6, N7 (since its value is relatively high, for example, about 1.5 mA-2 mA). Therefore, the transistors N3, N4 and the transistors N6, N7 often must be very large (and then with a low resistance) to ensure the correct operation of the circuit.

During the program operation, the biasing voltage ARRBURIED is brought to the supply voltage VDD and the biasing voltage TOARRBURIED raises from 4V to 10V. In such a way, the transistor P1 switches off and no current may flow through the transistors P1 and P2 (the transistors P3 and P4 being off).

Moreover, the biasing voltage NEGPW and the biasing voltage TONEGPW are brought to −1.4V and to −0.5V, respectively, so that the transistor N2 switches on.

Thus, a current flows through the transistors N1 and N2 and the voltage PL, starting from the ground voltage, reaches the biasing voltage NEGPW(−1.4V) of the source terminal of the transistor N2.

In this phase, the transistor P5 is off; at the same time the biasing voltage TOPL is at ground and maintains the transistor N5 off as well. Therefore, the node SL and the node PL are not connected to each other, and thus the voltage SL remains at the ground voltage (reached during the preceding operation, typically an erase-discharge operation).

Similar considerations apply to the read operation and to the verify operation.

Figure 3:
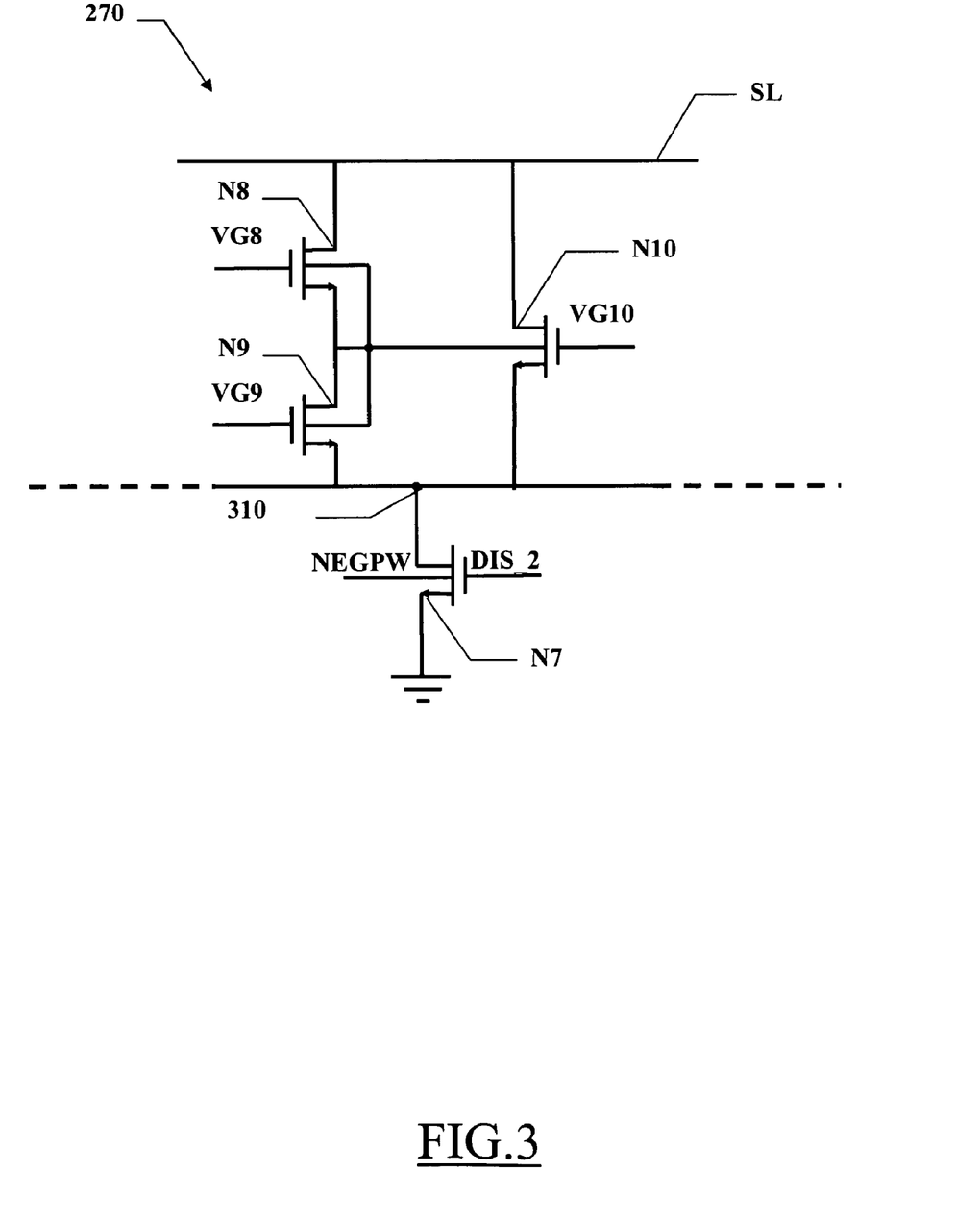
FIG. 3 shows a portion of a p-well-source switch of the memory device of FIG. 1 according to an embodiment of the invention.

Considering now FIG. 3, an exemplary implementation of the source discharger 270 according to an embodiment of the invention is shown. The source discharger 270 includes a first n-MOS transistor N8 connected in series with a second n-MOS transistor N9. The series of the transistors N8 and N9 is connected in parallel with a third n-MOS transistor N10. Particularly, the transistor N8 has the drain terminal connected to the node SL, the source terminal connected to the drain terminal of the transistor N9, and the gate terminal that receives a biasing voltage VG8. The source terminal of the transistor N9 is connected to a common node 310 and the gate terminal receives a biasing voltage VG9. The transistor N10 has the source terminal connected to the common node 310, the drain terminal connected to the node SL and the gate terminal that receives a biasing voltage VG10. The substrate terminals of the transistors N8, N9 and N10 are connected together to the source terminal of the transistor N8. The common node 310 is connected to the ground terminal through the same transistor N7 described with reference to FIG. 2 (which receives the biasing voltage DIS_2 at its gate terminal and the biasing voltage NEGPW at its substrate). The common node 310 is connected to the same nodes of the source dischargers of all the other p-well-source switches that are included in the matrix.

As described above, the voltage at the node SL is affected by the erase operation and by the erase-discharge operation (while it always remains at ground during the other operations); therefore the functioning of the source discharger 270 will be described in the following only for those operations.

Figure 4:
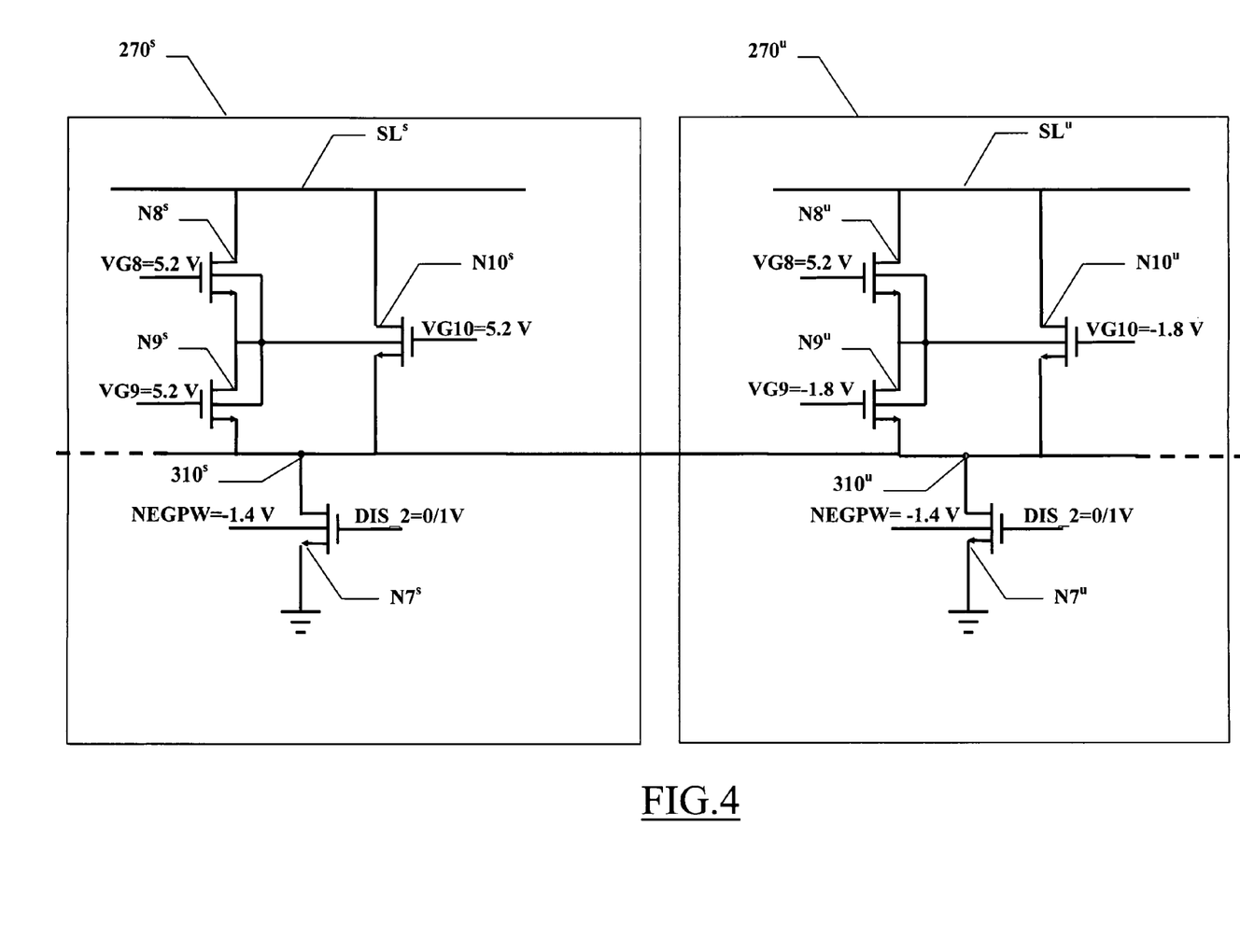
FIG. 4 is a functional representation of the p-well-source switch of FIG. 3 according to an embodiment of the invention.

For this purpose, as shown in FIG. 4, two source dischargers are considered: a source discharger $270^s$ relating to a selected block and a further source discharger $270^u$ relating to an unselected block (from now on, the suffixes "s" and "u" will be added to the references of the source dischargers to discriminate the selected one from the unselected one).

As can be seen, the node $310^s$ is connected to the node $310^u$.

During the erase operation, a biasing voltage of 5.2 V switches on the transistors $N8^s$, $N9^s$, $N10^s$ and $N8^u$. At the same time, a biasing voltage of −1.8 V switches off the transistors $N9^u$ and $N10^u$. The transistors $N7^u$ and $N7^s$ are kept off (by taking their gate terminals at the ground voltage). Moreover, as described above, the substrate terminals of the transistors $N7^u$ and $N7^s$ also receive the biasing voltage NEGPW equal to −1.4 V for ensure their correct biasing.

As indicated in the foregoing, the voltage $SL^s$ rises from 4V to 10V (status SSM) while the voltage $SL^u$ is at −1.8V (status USM).

In this biasing condition, the transistors $N8^s$, $N9^s$ and $N10^s$ bring the voltage of the node $310^s$ to about 5.2 V (i.e., 5.2 V minus their threshold voltages). The voltage of the source terminal of the transistor $N8^s$ is brought substantially to the same value. In this way, the substrate terminals of the transistors $N8^s$, $N9^s$ and $N10^s$ are correctly biased at about 5.2V.

At the same time, the transistors $N9^u$ and $N10^u$ (off) insulate the node $310^u$ from the node $SL^u$; therefore, the node $310^u$ can reach the voltage of the node $310^s$ (i.e., 5.2V) without any problem. At the same time, the transistor $N8^u$ brings the substrate terminals of the transistors $N8^u$, $N9^u$ and $N10^u$ to the voltage −1.8V of the node $SL^u$, so as to ensure their correct biasing.

During the subsequent erase-discharge operation, the biasing voltage DIS_2=1V switches on the transistors $N7^s$ and $N7^u$ and consequently the desired discharge current flows from the transistors $N8^s$, $N9^s$ and $N10^s$ to the transistors $N7^u$ and $N7^s$.

Therefore, once the discharge current from the transistors $N8^s$, $N9^s$ and $N10^s$ reaches the node $310^s$ it splits into multiple currents flowing through all the transistors N7 (both of the selected block and of the unselected blocks). Assuming that the transistors N7 have the same size, the current flowing through each one of them is equal to the (total) discharge current divided by the number of blocks in the matrix; therefore, the corresponding voltage drop will be reduced accordingly.

In other words, this solution exploits the transistors $N7^u$ of the unselected blocks (in addition to the transistor $N7^s$ of the selected block) for discharging the source line $SL^s$ of the selected block; this emulates the availability of a virtual transistor for each block having a size equal to the sum of the ones of all the transistors N7.

As a result, the desired behavior of the circuit is achieved with a reduced size of the transistors N7 (with respect to the solution known in the art described in FIG. 2). It should be noted that in the embodiment at issue (based on MOS transistors) this result is difficult to achieve using the two transistors N6 and N7 only (by simply connecting all the transistors N7 in parallel), because it would be difficult to bias correctly the substrate terminals of the transistors N6 in every condition.

Moreover, the reduced size of the transistors N7 allows increasing the size of the other transistors, in particular of the transistors N10.

For example, typical values for the size of the transistors shown in FIG. 4 (expressed in terms of the width and length of their channels) are listed in the following table:

|  | W (μm) | L (μm) |
|---|---|---|
| $N10^s = N10^u$ | 150 | 0.8 |
| $N7^s = N7^u$ | 30 | 0.8 |
| $N8^s = N8^u = N9^s = N9^u$ | 10 | 0.8 |

Naturally, in order to satisfy local and specific requirements, a person skilled in the art may apply to the solution described above many modifications and alterations. Particularly, although an embodiment of the present invention has been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent components (for example, it has a NAND architecture, it is based on phase-change elements, and so on).

Moreover, the numerical examples provided above are merely illustrative, and they are not to be interpreted as a limitation.

In any case, it should be noted that the proposed solutions can also be applied to subsets of blocks in every matrix (for example, by closing only some of the transistors of the unselected blocks).

Moreover, it will be apparent to those skilled in the art that the additional features providing further advantages are not essential for carrying out the invention, and may be omitted or replaced with different features.

For example, other circuital implementations (based on any number of transistors) are not excluded.

It should be noted that although in the preceding description a significant reference has been made to the erase operation, this is not to be intended as a limitation; indeed, the same techniques can also be applied to bias the desired circuit node during further operations performed on the memory device.

Similar considerations apply if the proposed solution is used to bias further circuit nodes with other voltages (for example, the source lines).

Likewise, alternative solutions for biasing the substrate of the MOS transistors are tenable.

It is also conceivable to control those transistors in a different way.

In any case, the use of other types of transistors, for example, bipolar junction transistors is within the scope of the invention.

In addition, the application of the proposed solution to different non-volatile memory devices (such as to bias the matrices of a standard flash memory) is contemplated.

Referring to FIGS. 1, 3, and 4, the memory device 100, including one or more of the source dischargers 270, may be incorporated within an electronic system such as a computer system.

The invention claimed is:

1. A non-volatile memory device including a plurality of blocks of memory cells, each block having a common biasing node for each memory cell in the block, biasing means for providing a biasing voltage, and selection means for selectively applying the biasing voltage to the common biasing node of a selected block, for each block the selection means including first switching means and second switching means connected in series, the first switching means being connected with the common biasing node and the second switching means being connected with the biasing means, wherein
the second switching means of each block further comprising being connected in parallel with each other, the selection means including means for closing the first switching means of the selected block and the second switching means of each of the blocks, and for opening the first switching means of each unselected block.

2. The memory device according to claim 1, wherein the first switching means includes a first transistor and a second transistor being connected in series, the first transistor being connected to the biasing node and the second transistor being connected to the second switching means, and a third transistor connected in parallel to the series of the first and second transistors.

3. The memory device according to claim 2, wherein each transistor is a MOS transistor formed in a substrate region, the substrate regions of all the transistors being connected to an interconnection node between the first transistor and the second transistor.

4. The memory device according to claim 2, wherein the selection means is adapted to open the second and third transistors and to close the first transistor of each unselected block.

5. The memory device according to claim 1 wherein the memory device is integrated in a chip of semiconductor material and each block is formed in a corresponding insulating well, the biasing node of each block being adapted to bias the corresponding insulating well.

6. The memory device according to claim 5, wherein the biasing voltage is a discharge voltage for discharging the insulating well of the selected block after an erasure operation.

7. The memory device according to claim 6, wherein each transistor is an n-MOS transistor, and wherein the second switching means includes a further n-MOS transistor, the biasing voltage being a reference voltage.

8. The memory device according to claim 1, wherein the memory device is a flash memory.

9. The memory device according to claim 8, wherein the memory device includes at least one matrix of memory cells including a plurality of said blocks, each block including a plurality of words being individually erasable.

10. A memory, comprising:
groups of nonvolatile memory cells, each group having a respective local biasing node that is coupled to the memory cells within the group;
a global biasing node;
a reference node;
first switch circuits each associated with a respective one of the groups and each coupled between the local biasing node of the associated group and the global biasing node; and
second switch circuits each associated with a respective one of the groups and each coupled between the global biasing node and the reference node.

11. The memory of claim 10, wherein:
each memory cell has a source; and
the local biasing node of each group is coupled to the sources of the memory cells within the group.

12. The memory of claim 10, wherein:
each memory cell has a body; and
the local biasing node of each group is coupled to the bodies of the memory cells within the group.

13. The memory of claim 10, wherein the reference node comprises a ground node.

14. The memory of claim 10 wherein each first switch circuit comprises:
a first transistor having a first conduction node coupled to the local biasing node of the associated group of memory cells and having a second conduction node;
a second transistor having a first conduction node coupled to the second conduction node of the first transistor and a having second conduction node coupled to the global biasing node; and
a third transistor having a first conduction node coupled to the local biasing node of the associated group of memory cells and having a second conduction node coupled to the global biasing node.

15. The memory of claim 10 wherein each first switch circuit comprises:
a first NMOS transistor having a drain coupled to the local biasing node of the associated group of memory cells, a source, and a body coupled to the source;
a second NMOS transistor having a drain coupled to the source of the first transistor, a source coupled to the global biasing node, and a body coupled to the body of the first transistor; and
a third NMOS transistor having a drain coupled to the local biasing node of the associated group of memory cells, a source coupled to the global biasing node, and a body coupled to the body of the first transistor.

16. The memory of claim 10 wherein each second switch circuit comprises a transistor having a first conduction node coupled to the reference node and having a second conduction node coupled to the global biasing node.

17. The memory of claim 10 wherein each second switch circuit comprises an NMOS transistor having a source coupled to the reference node, a drain coupled to the global biasing node, and a body coupled to a body biasing node.

18. The memory of claim 10, further comprising:
a substrate;
wells disposed in the substrate; and
wherein each group of memory cells is disposed in a respective one of the wells.

19. The memory of claim 10, further comprising:
a substrate;
wells disposed in the substrate;
wherein each group of memory cells is disposed in a respective one of the wells; and
wherein the local biasing line of each group is coupled to the well in which the group is disposed.

20. The memory of claim 10, further comprising:
a substrate;
first wells, second wells, and third wells disposed in the substrate;

wherein each group of memory cells is disposed in a respective one of the first wells;
wherein each of the first switch circuits is disposed in a respective one of the second wells; and
wherein each of the second switch circuits is disposed in a respective one of the third wells.

21. An electronic system, comprising:
a memory, comprising,
groups of nonvolatile memory cells, each group having a respective local biasing node that is coupled to the memory cells within the group;
a global biasing node;
a reference node;
first switch circuits each associated with a respective one of the groups and each coupled between the local biasing node of the associated group and the global biasing node; and
second switch circuits each associated with a respective one of the groups and each coupled between the global biasing node and the reference node.

* * * * *

UNITED STATES PATENT AND TRADEMARK OFFICE
CERTIFICATE OF CORRECTION

PATENT NO. : 7,580,289 B2  Page 1 of 1
APPLICATION NO. : 11/441925
DATED : August 25, 2009
INVENTOR(S) : Conte et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 394 days.

Signed and Sealed this

Fourteenth Day of September, 2010

David J. Kappos
*Director of the United States Patent and Trademark Office*